(12) United States Patent
Chua et al.

(10) Patent No.: US 6,924,233 B1
(45) Date of Patent: Aug. 2, 2005

(54) PHOSPHOR DEPOSITION METHODS

(75) Inventors: Janet Bee Yin Chua, Penang (MY); Azlida Ahmad, Penang (MY); Christopher J. Summers, Dunwoody, GA (US); Hisham Menkara, Mableton, GA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/804,759

(22) Filed: Mar. 19, 2004

(51) Int. Cl.$^7$ .............................................. H01L 21/44
(52) U.S. Cl. ........................ 438/678; 438/30; 438/144; 438/28
(58) Field of Search ........................... 438/678, 28, 30, 438/144

(56) References Cited

U.S. PATENT DOCUMENTS 5,813,753 A * 9/1998 Vriens et al. ................ 362/293
5,998,925 A * 12/1999 Shimizu et al. ............. 313/503
6,218,774 B1 * 4/2001 Pope .......................... 313/461
6,576,488 B2 * 6/2003 Collins et al. ................ 438/29

* cited by examiner

Primary Examiner—Thao P. Le (57) ABSTRACT

Methods of coating a semiconductor device with phosphor particles are disclosed. In the methods, a bath is provided which contains suspended particles of a first phosphor material and suspended particles of a second phosphor material. The particles of the first phosphor material have a mean particle size in the range from about 1 micron to about 6 microns, and the particles of the second phosphor material have a mean particle size in the range from about 12 microns to about 25 microns, wherein the particle size distribution of the phosphor material in the bath is bimodal. The semiconductor device is disposed in the bath containing the suspended particles, and a first biasing voltage is applied between an anode in electrical contact with the bath and the p side to hold the anode at a positive voltage with respect to the p side. A second biasing voltage is applied between the p side and the n side. In particular embodiments, the method results in a substantially conformal coating of the phosphor particles being deposited on at least one surface of the semiconductor structure.

28 Claims, 3 Drawing Sheets

PHOSPHOR DEPOSITION METHODS

DESCRIPTION

1. Field of the Invention

The invention relates generally to light emitting devices and more particularly to electrophoretic methods of forming phosphor coatings on semiconductor devices.

2. Background of the Invention

Conventional white light sources include such devices as incandescent and fluorescent lamps. Such devices have several undesirable characteristics, including size, power consumption, limited operating life, among others. Alternative white light sources having improved characteristics are desired.

Semiconductor devices have been investigated as alternative sources of white light with a goal of finding white light sources that are both power efficient and cost efficient. Light emitting diodes (LEDs) are compact and emit light of clear color with high efficiency. Because they are solid-state elements, LEDs have long operating lifetimes, have good initial drive characteristics, exhibit good vibration resistance, and withstand repetitive ON/OFF operations. Thus, they have been widely used in such applications as various indicators and various light sources. In many applications, LEDs can provide suitable sources of light with low power consumption.

Conventional LEDs typically have a narrow emission spectrum (generate monochromatic light), and thus do not have a broad emission spectrum necessary to provide white light. Recently, devices using a combination of LEDs to provide three light components of red, green, and blue (R, G and B) have been used to provide white light. Large screen LED displays using these light emitting diodes have been put into use. Strategies for diffusing and mixing the light emitted by the LEDs become important in such devices to generate white light of the desired tone, luminance and other factors of the light emission of such devices. Also, combining three diodes (R, G and B) to provide white light requires a larger package than a single diode. Recently developed devices incorporate multiple light-generating active regions on a single semiconductor chip, where the multiple active regions each emit in a distinct wavelength region such that the combination of active regions cover the visible spectrum to emit white light.

Another typical approach for generating white light combines UV or blue light emitting diodes with luminescent materials (such as phosphors) that down-convert the LED emission to longer wavelength light. In such devices, the UV or blue light emission from an active region of a light emitting diode activates (excites) a phosphor composition that is positioned to receive the LED emitted light. In turn, the excited phosphor composition emits light at a longer wavelength. The net result is a light emitting device that emits light having a plurality of wavelengths over the visible spectrum. An appropriate combination of different wavelengths over the visible spectrum can be perceived as white light by the human eye. The composition of the phosphor is typically adjusted to change the color balance of the emitted light. For example, one phosphor successfully used is yttrium aluminum garnet: cesium doped (YAG:Ce) phosphor. YAG:Ce phosphor has the advantage that the cesium activator strongly absorbs in the blue region and internally down converts this radiation into a broad yellowish spectrum, which combines with the blue light emission from the LED to produce a white spectrum. Other potential phosphor systems can use two activators or be excited in the blue or UV region.

In some cases, the phosphor composition contains more than one phosphor, wherein each phosphor emits at a different wavelength. For example, U.S. Pat. Nos. 5,813,753 and 5,998,925 disclose light emitting devices in which a blue LED disposed in a reflective cup is surrounded by a phosphor composition. The blue LED emits blue light, a portion of which excites the phosphors in the phosphor composition. The phosphors are selected such that they emit red and green light upon excitation. The device will typically emit a combination of blue light (unabsorbed emission from the LED), and red light and green light (from the phosphors). The combination of wavelengths of light can be perceived by the human eye as white. The phosphor typically ages over the lifetime of the device, changing the efficiency with which the LED emission is converted to higher wavelength. Thus the output light characteristic of the device changes over the lifetime of the device, especially where multiple phosphors are used.

The commercial technique typically employed in phosphor deposition on LEDs involves the use of phosphor powders blended in a liquid polymer system, such as polypropylene, polycarbonate or, more commonly, epoxy resin, or silicone. Generally, a small amount of the phosphor-impregnated epoxy is simply painted or dispensed on the LED die, then dried or cured. A clear epoxy lens is then constructed around the die, although a phosphor-impregnated epoxy can be used to construct the whole LED lens. Other techniques have also included dusting phosphor powders or spray painting phosphor powders liquid mixtures directly on the LED die.

Such phosphor deposition methods tend to be inefficient in production and less than optimum in result. Rather than selectively coating only the light emitting regions of the diode, the phosphor is deposited over the whole diode package. Much of the phosphor is wasted, washing off during application and requiring retrieval later. The phosphor does not make good contact with the diode surface in the most desired locations for efficient energy transfer from the diode to the phosphor. In addition, the current phosphor deposition methods are difficult to translate into mass production for coating many single diodes and for coating large arrays of diodes mounted on circuit or ceramic boards.

Electrophoretic methods have recently been described for phosphor deposition in the context of coating semiconductor devices. In U.S. patent application Ser. No. 10/277,285 to Summers et al., filed on Oct. 22, 2002, methods are taught for electrophoretically coating a semiconductor device having a p side and an n side using a bath containing suspended particles. A first biasing voltage is applied between the anode and the p side to hold the anode at a positive voltage with respect to the p side. A second biasing voltage is applied between the p side and the n side to cause the suspended particles to deposit on the semiconductor device. Further examples of electrophoretic methods for phosphor deposition are described in U.S. Pat. No. 6,576,488 to Collins, III, et al. (issued Jun. 10, 2003). The methods of the '488 patent involve coupling a semiconductor device to a submount and then applying a first bias voltage to the submount and a second bias voltage to a solution of charged phosphor particles. The charged phosphor particles deposit on the conductive surfaces of the semiconductor device.

Previously reported electrophoretic methods have focused on, for example, the chemical identity of the components in the electrophesis bath, and on the uniformity of thickness of the resulting layer of deposited material on the semiconductor device. These methods report achieving superior results compared to previous bulk methods of phosphor deposition, achieving solid-state lamps with improved color repeatability and uniformity, and being more appropriate for color-critical applications. However, further refinements and improvements are desirable. It is desirable to have a method of depositing materials on a semiconductor device to provide a semiconductor device that is relatively small, light weight, has a long effective operating life, is power efficient, and has desirable operating characteristics.

SUMMARY OF THE INVENTION

The invention addresses the aforementioned deficiencies in the art, and provides an electrophoretic method for depositing particulate materials onto semiconductor devices. The invention provides a method for coating a semiconductor device having a p side and an n side. The method includes providing a bath containing suspended particles, wherein the suspended particles include particles of a first phosphor material and particles of a second phosphor material. The particles of the first phosphor material have a mean particle size in the range from about 1 microns to about 6 microns, and the particles of the second phosphor material have a mean particle size in the range from about 12 microns to about 25 microns, such that the particle size distribution of the phosphor material in the bath is bimodal. In the method of the invention, an anode is disposed in electrical contact with the bath, and the semiconductor device is disposed in the bath in contact with the suspended particles. A first biasing voltage is applied between the anode and the p side to hold the anode at a positive voltage with respect to the p side. A second biasing voltage is applied between the p side and the n side to cause the suspended particles to deposit on the semiconductor device.

The relative biasing of the p side and the n side determines where coating is deposited on the semiconductor device. An optional pre-coating process may be used to deposit a high resistivity dielectric material, such as silica, on the semiconductor device. The pre-coating can even the electric field on the surface of the semiconductor device, where local features such as metal connections or passivation layers disturb the electric field during phosphor deposition without pre-coating.

The invention provides a method for coating a light emitting diode having a p side and an n side. The method includes providing a bath containing suspended phosphor particles, wherein the suspended phosphor particles include particles of a first phosphor material and particles of a second phosphor material. The particles of the first phosphor material have a mean particle size in the range from about 1 microns to about 6 microns, and the particles of the second phosphor material have a mean particle size in the range from about 12 microns to about 25 microns, such that the particle size distribution of the phosphor material in the bath is bimodal. An anode is disposed in the bath with the light emitting diode. A first biasing voltage is applied between the anode and the p side to hold the anode at a positive voltage with respect to the p side. A second biasing voltage is applied between the p side and the n side to cause the phosphor particles to deposit on the light emitting diode.

The relative biasing of the p side and the n side determines where coating is deposited on the light emitting diode. An optional pre-coating process may be used to deposit a high resistivity dielectric material, such as silica, on the light emitting diode. The pre-coating can even the electric field on the surface of the light emitting diode, where local features such as metal connections or passivation layers disturb the electric field during phosphor deposition without pre-coating.

Additional objects, advantages, and novel features of this invention are set forth in part in the descriptions and examples that follow and in part will become apparent to those skilled in the art upon examination of the following specifications or may be learned by the practice of the invention. The objects and advantages of the invention may be realized and attained by means of the instruments, combinations, compositions and methods particularly pointed out in the appended claims.

BRIEF DESCRIPTION OF THE DRAWINGS

These and other features of the invention will be understood from the description of representative embodiments of the method herein and the disclosure of illustrative apparatus for carrying out the method, taken together with the Figures, wherein.

To facilitate understanding, identical reference numerals have been used, where practical, to designate corresponding elements that are common to the Figures. Figure components are not drawn to scale.

DETAILED DESCRIPTION AND EXEMPLARY EMBODIMENTS

Before the invention is described in detail, it is to be understood that unless otherwise indicated this invention is not limited to particular materials, reagents, reaction materials, manufacturing processes, or the like, as such may vary. It is also to be understood that the terminology used herein is for purposes of describing particular embodiments only, and is not intended to be limiting. It is also possible in the present invention that steps may be executed in different sequence where this is logically possible. However, the sequence described below is preferred.

It must be noted that, as used in the specification and the appended claims, the singular forms "a," "an" and "the" include plural referents unless the context clearly dictates otherwise. Thus, for example, reference to "a phosphor particle" includes a plurality of phosphor particles. In this specification and in the claims that follow, reference will be made to a number of terms that shall be defined to have the following meanings unless a contrary intention is apparent.

The following description is put forth so as to provide those of ordinary skill in the art with a complete disclosure and description of how to perform the methods and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Standard temperature and pressure are defined as 20° C. and 1 atmosphere. The practice of the present invention will employ, unless otherwise indicated, conventional techniques of semiconductor manufacture, packaging, coating, materials synthesis, and the like, which are within the skill of the art. Such techniques are explained fully in the literature.

As used herein, "LED" or "light emitting diode" refers to a device having stack of semiconductor layers (a "chip"), including an active region which emits light when biased to produce an electrical current flow through the device, and contacts attached to the stack. "Phosphor" refers to any luminescent materials which absorb light of one wavelength and emit light of a different wavelength. "Light emitting device" refers to a device that includes an LED and a phosphor composition, wherein the phosphor composition is adapted to receive excitation light from the LED and emit light having a longer wavelength than the excitation light. "Excitation" refers to the process whereby the phosphor composition receives light. "White light emitting device" refers to a light emitting device that is capable of producing white light. "White light" refers to light that is perceived as white by a typical human observer; particular embodiments of white light include light that has a 'correlated color temperature' (CCT) in the range of about 3000 K to about 6500 K and has a color rend more typical embodiments, the CCT is in the range of about 4800 to about 6500 K. In this regard, CCT is defined as the absolute temperature (expressed in degrees Kelvin) of a theoretical black body whose chromaticity most nearly resembles that of the light source. CRI is an indication of a light source's ability to show individual colors relative to a standard; the CRI value is derived from a comparison of the lamp's spectral distribution compared to a standard (typically a black body) at the same correlated color temperature. Both CCT and CRI are as known and used in the industry.

Figure 1:
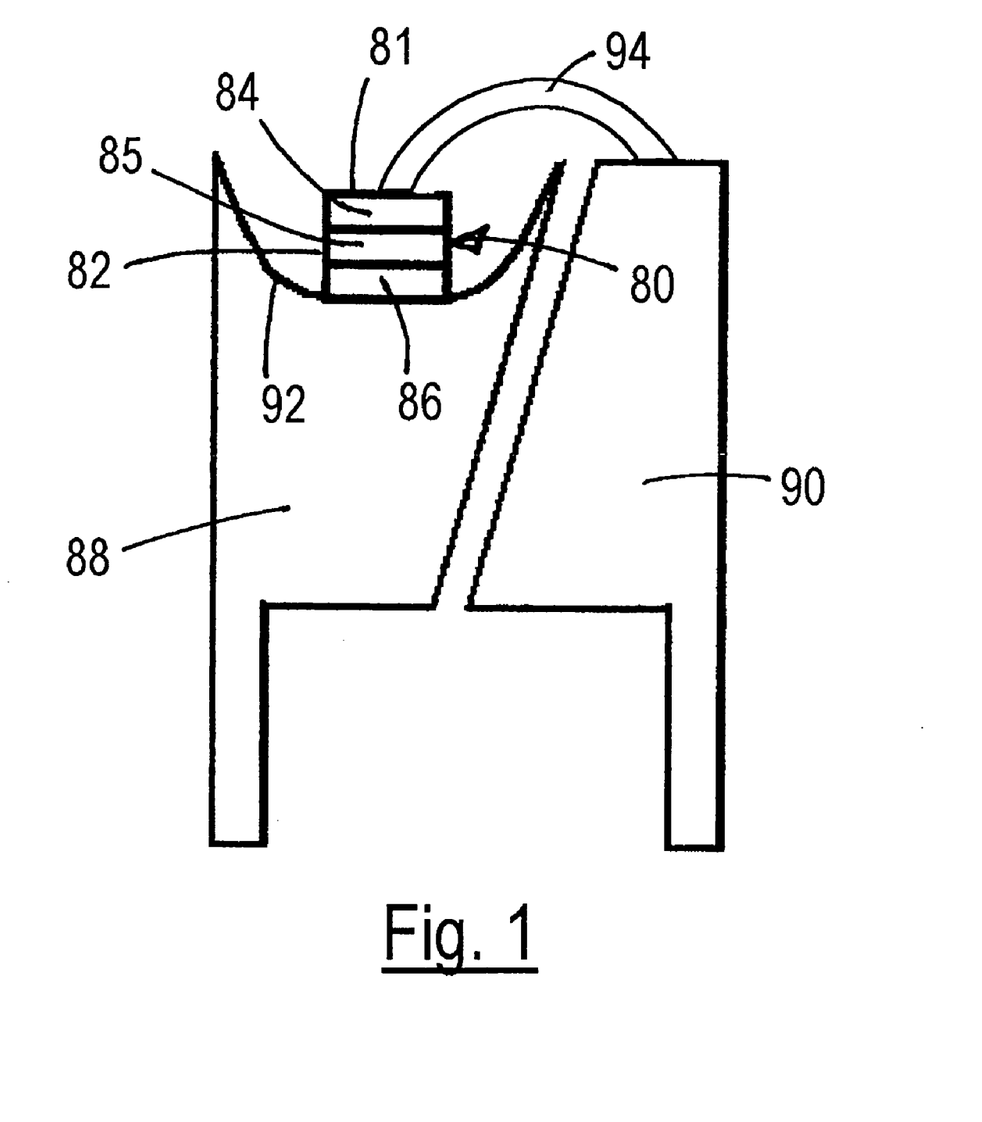
FIG. 1 shows a schematic diagram of a typical flat LED mounted in a reflective cup.

A schematic diagram of a typical flat LED mounted in a reflective cup is shown in FIG. 1. The LED chip 80, having a top 81 and sides 82, comprises a p side 84, an active region 85, and an n side 86. A first leadframe 88 and second leadframe 90 can provide electrical connections between the LED chip 80 and a circuit board (not shown). The LED chip 80 is disposed in a reflective cup 92 in the first leadframe 88 to reflect light generated by the LED chip 80. The first leadframe 88 can be electrically connected to the n side 86 directly by contact or wirebonded. The second leadframe 90 can be electrically connected to the p side 84 by gold wire 94 at the top or side of the LED chip 80.

Rather than the flat LED chip illustrated in FIG. 1, the LED chip can have an inverted trapezoidal geometry, with the large face of the trapezoid on the top, so that the light generated within the p side reflects internally and passes upwards from the LED chip. The inverted trapezoidal geometry has the disadvantage of requiring extra diode material to achieve the proper reflection angle. The trapezoidal, or any other externally shaped LED chip, can be used with or without a reflective cup.

To achieve light emission, the LED chip 80 is typically forward biased by 2 to 4 Volts, equivalent to the band gap energy of the semiconductor, i.e., the p side 84 is held at a positive 2 to 4 Volts over the n side 86. In general, light emission occurs from the p side 84 of the LED chip 80 and is emitted most intensely from the sides 82 of the LED chip 80, and less intensely from the top 81 of the p side 84.

In devices that have a phosphor coating on the LED chip, the light emitted from the LED chip passes through the phosphor coating, and phosphor particles in the phosphor coating absorb a portion of the light (the 'excitation light') emitted from the LED chip. The absorption of the excitation light by the phosphor particles results in down-conversion (conversion to longer wavelength) of the excitation light, thus producing light having a wavelength longer than the excitation light. The light emitted from the phosphor-coated LED device thus has a plurality of wavelength components, due to (a) light emitted from the LED chip that passes (unabsorbed) through the phosphor coating, and (b) light emitted from the phosphor coating resulting from down-conversion of phosphor-absorbed, LED-emitted light.

Accordingly, the present invention provides methods of depositing particulate materials onto semiconductor devices. A method in accordance with the present invention provides for coating a semiconductor device having a p side and an n side. The method includes providing a bath containing suspended particles, wherein the suspended particles include particles of a first phosphor material and particles of a second phosphor material. The particles of the first phosphor material have a mean particle size in the range from about 1 microns to about 6 microns, and the particles of the second phosphor material have a mean particle size in the range from about 12 microns to about 25 microns, such that the particle size distribution of the phosphor material in the bath is bimodal.

In the method of the invention, an anode is disposed in electrical contact with the bath, and the semiconductor device is disposed in the bath where it may contact the suspended particles. A first biasing voltage is applied between the anode and the p side to hold the anode at a positive voltage with respect to the p side. A second biasing voltage is applied between the p side and the n side to cause the suspended particles to deposit on the semiconductor device.

The relative biasing of the p side and the n side determines where coating is deposited on the semiconductor device. An optional pre-coating process may be used to deposit a high resistivity dielectric material, such as silica, on the semiconductor device. The pre-coating can even the electric field on the surface of the semiconductor device, where local features such as metal connections or passivation layers disturb the electric field during phosphor deposition without pre-coating.

The invention provides a method for coating a light emitting diode having a p side and an n side. The method includes providing a bath containing suspended phosphor particles, wherein the suspended phosphor particles include particles of a first phosphor material and particles of a second phosphor material. The particles of the first phosphor material have a mean particle size in the range from about 1 microns to about 6 microns, and the particles of the second phosphor material have a mean particle size in the range from about 12 microns to about 25 microns, such that the particle size distribution of the phosphor material in the bath is bimodal.

An anode is disposed in electrical contact with the bath, and the light emitting diode is disposed in the bath where it may contact the suspended particles. A first biasing voltage is applied between the anode and the p side to hold the anode at a positive voltage with respect to the p side. A second biasing voltage is applied between the p side and the n side to cause the phosphor particles to deposit on the light emitting diode.

The relative biasing of the p side and the n side determines where coating is deposited on the light emitting diode. An optional pre-coating process may be used to deposit a high resistivity dielectric material, such as silica, on the light emitting diode. The pre-coating can even the electric field on the surface of the light emitting diode, where local features such as metal connections or passivation layers disturb the electric field during phosphor deposition without pre-coating.

Figure 2:
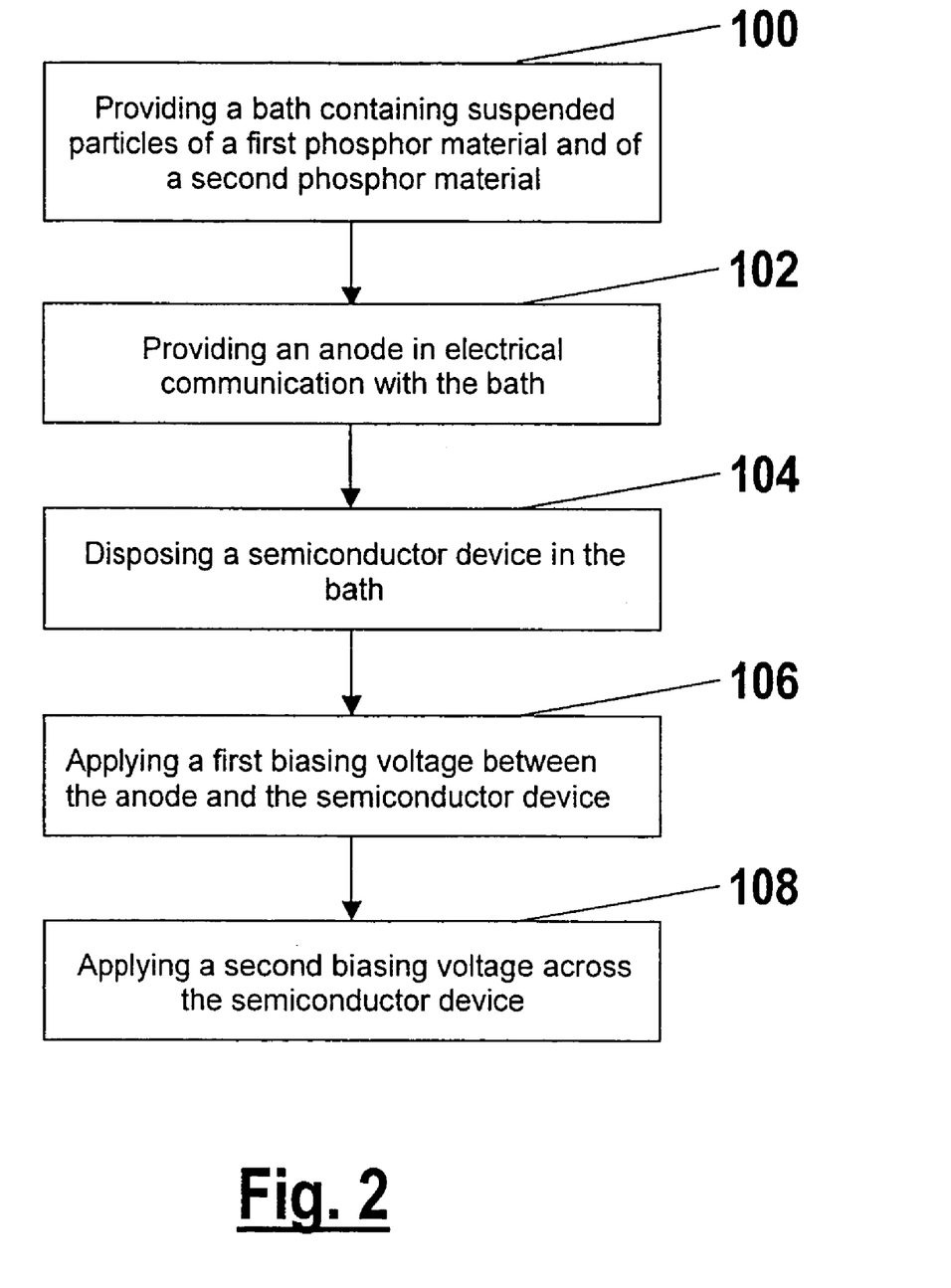
FIG. 2 shows a flow chart of a method for selectively depositing materials on a semiconductor device of the present invention.

FIG. 2 shows a flow chart of a method for selectively depositing materials on a semiconductor device of the present invention. At 100, a bath containing suspended particles is provided. The suspended particles include particles of a first phosphor material and particles of a second phosphor material. Typically, the bath comprises a solvent with a solid electrolyte dissolved in the solvent. In some embodiments, the bath may also contain a binder material that helps phosphor particles securely adhere to the surface of the semiconductor device (e.g. light emitting diode) and to each other. Selection of electrolytes and binder materials is within the skill of those in the art given the disclosure herein. The particles of the first phosphor material have a mean particle size in the range from about 1 microns to about 6 microns, and the particles of the second phosphor material have a mean particle size in the range from about 12 microns to about 25 microns, such that the particle size distribution of the phosphor material in the bath is bimodal. In certain embodiments, the suspended particles in the bath may optionally include particles of a high resistivity dielectric material. An anode is provided in electrical communication with the bath 102, e.g. disposed in the bath. A semiconductor device is disposed in the bath 104. Typically, the semiconductor device is an LED or other semiconductor device having a light emitting area and having an n-side and a p side. At 106, a first biasing voltage is applied between the anode and the n-side of the semiconductor device, with the anode held positive with respect to the n-side. A second biasing voltage is applied between the p side and the n-side of the semiconductor device 108. The second biasing voltage is typically switchable between reverse bias, zero bias, and forward bias, so the suspended particles are deposited on the desired area of the semiconductor device. It is also possible in the present invention that the steps described may be executed in different sequence where this is logically possible. For example, the semiconductor device may be disposed in the bath 104 before the anode is provided 102. As another example, the second biasing voltage may be applied 108 before or concurrently with the first biasing voltage 106. Optionally, a mask can be applied to the semiconductor device to further limit the deposition regions on the semiconductor device. Additional layers, deposits of different materials, deposits on different regions of the semiconductor device, or combinations thereof are possible by repeating the method.

The first phosphor material has a mean particle diameter that is in the range from about 1 micron to about 6 microns, typically in the range from about 2 to about 5 microns. In an embodiment, the first phosphor material has a particle size distribution such that the span of particle diameters from the $25^{th}$ volume percentile to the $75^{th}$ volume percentile is in the range from about 2 microns to about 6 microns.

The second phosphor material has a mean particle diameter that is in the range from about 12 to about 25 microns, typically in the range from about 13 to about 22 microns, more typically in the range from about 14 to about 20 microns. In an embodiment the second phosphor material has a particle size distribution such that the span of particle diameters from the $25^{th}$ volume percentile to the $75^{th}$ volume percentile is in the range from about 2 microns to about 10 microns, more typically in the range from about 3 microns to about 6 microns.

As used herein, the span of particle diameters from the $25^{th}$ volume percentile to the $75^{th}$ volume percentile is calculated by subtracting the numeric value (in microns) for the particle size at the $25^{th}$ volume percentile from the numeric value (in microns) for the particle size at the $75^{th}$ volume percentile, to give the difference of the two values. This difference is the span of particle diameters from the $25^{th}$ volume percentile to the $75^{th}$ volume percentile. The volume size distribution of phosphor particles is measured by using a Coulter Counter with 50 micron aperture to obtain the $25^{th}$ and $75^{th}$ volume percentiles of particle diameters.

In particular embodiments, the particles of the first phosphor material make up at least about 20 volume percent, or at least about 30 volume percent, or at least about 40 volume percent, of the sum of the volumes of first phosphor material and the second phosphor material in the bath. In certain embodiments, the particles of the first phosphor material make up at most about 60 volume percent, or at most about 70 volume percent, or at most about 80 volume percent, of the sum of the volumes of first phosphor material and the second phosphor material in the bath. It follows that, in certain embodiments, the particles of the second phosphor material make up at least about 20 volume percent, or at least about 30 volume percent, or at least about 40 volume percent, of the sum of the volumes of first phosphor material and the second phosphor material in the bath. Also, in some embodiments, the particles of the second phosphor material make up at most about 60 volume percent, or at most about 70 volume percent, or at most about 80 volume percent, of the sum of the volumes of first phosphor material and the second phosphor material in the bath.

Particle sizes (diameters) may be determined by any suitable method, including microscopic examination, flow sorting, light scattering, screening, etc. Data obtained using a Coulter Counter may be used to characterize particles in samples containing particles of phosphor material. In typical embodiments, particles smaller than about 0.4 microns in diameter are ignored in determining particle size distributions. In such embodiments, the combined volume of particles having diameters smaller than 0.4 microns in a sample of particles is typically less than 5 volume percent of the total volume of all particles in the sample. In certain embodiments, particles larger than about 80 microns in diameter are ignored in determining particle size distributions. In such embodiments, the combined volume of particles having diameters greater than 80 microns in a sample of particles is typically less than 5 volume percent of the total volume of all particles in the sample. Thus, in certain embodiments, the particle size distribution is determined only in the range from 0.4 microns to 80 microns, and is bimodal in this range. Particle size distribution may be determined by plotting population count versus particle size for a sample containing particles of the phosphor material, wherein the sample is large enough to give a statistically accurate (>80% confidence) determination. It is appreciated that particle size distribution measurements may include small 'noise' data that renders determination of modes in the data difficult. An appropriate smoothing function may be used to analyze the size distribution such that small variations in the data are smoothed to make the determination of modes in the particle size distribution easier. "Bimodal" in reference to a particle size distribution means that there are at least two distinct populations of particles, a first population having a mean particle size in the range from about 1 micron to about 6 microns, and a second population having a mean particle size in the range from about 12 microns to about 25 microns, and a relative lack of a population of particles of intermediate size (i.e. there is a relative minimum in the particle size distribution between the mean particle size of the first population and the mean particle size of the second population).

In particular embodiments, the identity (chemical composition, or "type") of the first phosphor material may be same as the identity of the second phosphor material. In such embodiments, the bath may be provided by obtaining a first "lot" of phosphor particles having a mean particle diameter in the range from about 1 micron to about 6 microns, obtaining a second "lot" of phosphor particles having a mean particle diameter in the range from about 12 microns to about 25 microns, and combining the first and second lots in the bath. In particular such embodiments, each of the lots may be selected to have a desired particle size distribution. For example, the first lot may have a particle size distribution such that the span of particle diameters from the $25^{th}$ volume percentile to the $75^{th}$ volume percentile is in the range from about 2 microns to about 6 microns, and the second lot may have a particle size distribution such that the span of particle diameters from the $25^{th}$ volume percentile to the $75^{th}$ volume percentile is in the range from about 2 microns to about 10 microns, more typically in the range from about 3 microns to about 6 microns. The combination of the two "lots" of differently sized phosphor materials in the bath will provide a bimodal particle size distribution of the phosphor particles in the bath. In this context, a "lot" references a phosphor material that has been prepared such that the particles of the phosphor material have a desired particle size distribution, e.g. by screening the particles to separate the particles based on size, further e.g. by controlling the manufacturing process to obtain particles of desired size. Phosphor particles may be supplied (e.g. purchased) in pre-screened lots, or may be milled and screened to obtain desired lots. Any other method known to one of skill in the art of obtaining suitable phosphor compositions may be used.

In certain embodiments, the identity of the first phosphor material differs from the identity of the second phosphor material. In some such embodiments, the first phosphor material has a mean particle diameter in the range from about 1 micron to about 6 microns, and the second phosphor material has a mean particle diameter in the range from about 12 micron to about 25 microns, wherein each individual phosphor material has a 'unimodal' size distribution, but the combination of phosphor materials in the bath provides a bimodal size distribution.

However, in other such embodiments in which the identity of the first phosphor material differs from the identity of the second phosphor material, one or both of the first phosphor material and the second phosphor material may have a bimodal size distribution. For example, each of the phosphor materials may comprise a first "lot" of phosphor particles having a mean particle diameter in the range from about 1 micron to about 6 microns and a second "lot" of phosphor particles having a mean particle diameter in the range from about 12 microns to about 25 microns. The mean particle size of the first lot of the first phosphor material should be substantially the same as (+/−2 microns) the mean particle size of the first lot of the second phosphor material, and the mean particle size of the second lot of the first phosphor material should be substantially the same as (+/−2 microns) the mean particle size of the second lot of the second phosphor material. The bath is then obtained by combining the first phosphor material and the second phosphor material, wherein the particles of phosphor material in the bath have a bimodal size distribution.

The identities of the phosphor materials typically are selected based a number of criteria, including the emission characteristics of the semiconductor device to be coated, the excitation and emission characteristics of the particular phosphor materials, and other criteria apparent to those in the art given the disclosure herein. In some embodiments, a type of phosphor material that emits red light upon excitation is selected for use in the bath (e.g. as one of the first phosphor material or second phosphor material), and another type of phosphor material that emits green light upon excitation is selected for use in the bath (e.g. as the other of the first phosphor material or second phosphor material). A diode capable of emitting blue light that is electrophoretically coated in a bath in such an embodiment will emit light that will be perceived as white by a typical human observer. In certain embodiments, a type phosphor material is selected that emits yellow light upon excitation. In an embodiment, a combination of types of phosphor materials may be included in the bath, such as three different types of phosphor particles, e.g. a first type of phosphor particles that emits blue light upon excitation, a second type of phosphor particle that emits green light upon excitation, and a third type of phosphor particles that emits red light upon excitation.

The exact wavelength range for each type of phosphor particles will be determined by selection from available sources of phosphors, desired color attributes of the light emitting device (e.g. the 'correlated color temperature' of the emitted white light), choice of LED, and the like. Variation of such design parameters are within ordinary skill in the art given the disclosure herein. Useful phosphor materials and other information may be found in Mueller-Mach et al., "High Power Phosphor-Converted Light Emitting Diodes Based on III-Nitrides", IEEE J. Sel. Top. Quant. Elec. 8(2):339 (2002).

Each phosphor material to be included in the bath typically may be obtained in a range of particle sizes. In some embodiments, the mean particle diameter of the phosphor particles is in the range of 2–5 micrometers. Larger phosphor particles tend to emit light more efficiently; however, obtaining uniform coatings of phosphor particles becomes more difficult as size increases. Electrophoretic deposition methods have been used successfully with larger phosphor particles, e.g. having mean particle diameter in the range of about 13 micrometers to about 20 micrometers, and a d90 in the range of about 30 micrometers to about 45 micrometers, where d90 refers to the size at which 90 volume percent of the particles are smaller than the indicated size.

The thickness of the phosphor composition on the phosphor-bearing surface is typically in the range of about 15 micrometers to about 150 micrometers or more, more typically in the range of about 20 micrometers to about 120 micrometers, yet more typically in the range of about 25 micrometers to about 100 micrometers, although certain embodiments may be outside those ranges. The phosphor composition will typically be a conformal coating on the phosphor-bearing surface. The conformal coating is a coating having a uniform thickness, wherein the thickness does not vary by more than about 20%, typically not by more than about 10%. Further information on electrophoretic processes for phosphor deposition are disclosed in U.S. patent application 2002/0187571, and in U.S. patent application Ser. No. 10/425,860, filed Apr. 28, 2003, both of which are herein incorporated by reference in their entireties.

Figure 3A:
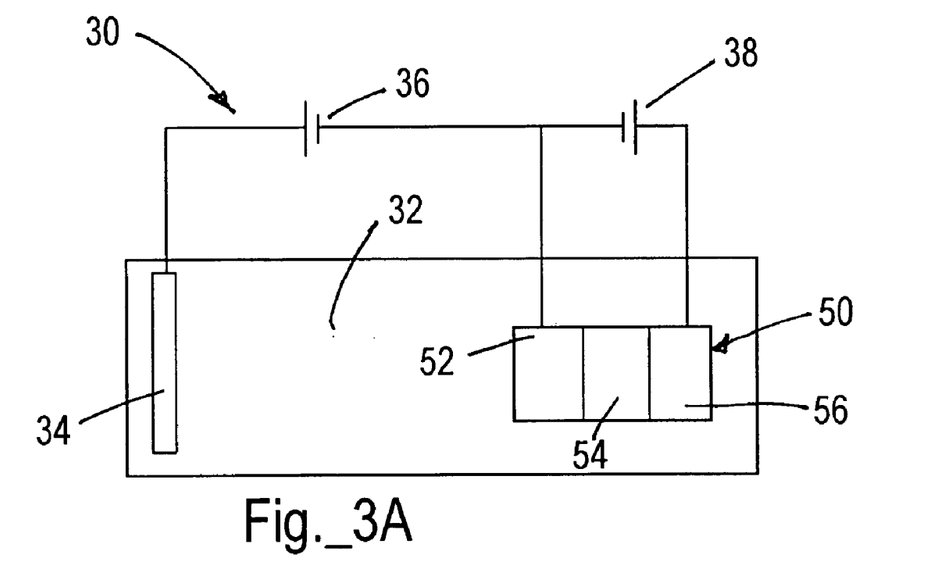
FIG. 3A and FIG. 3B depict an apparatus and potential plot, respectively, for a method for selectively depositing materials on a semiconductor device according to the present invention.
Figure 3B:
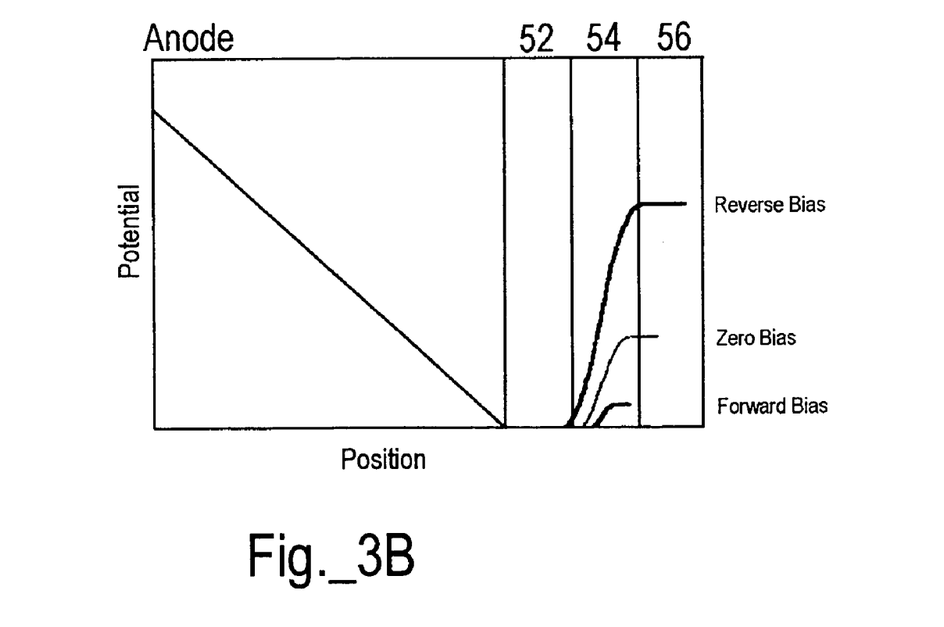

FIG. 3A and FIG. 3B show an apparatus block diagram and a potential plot, respectively, for the method for selectively depositing materials on a semiconductor device of the present invention. The exemplary case of phosphor particle deposition on a light emitting diode (LED) is presented.

The electrophoretic (EP) deposition apparatus 30 comprises a bath 32, an anode 34, a first power supply 36, and a second power supply 38. The EP deposition apparatus 30 is connected to a semiconductor device 50 to be coated. The electrical connections to the semiconductor device 50 depend on the configuration of the semiconductor device 50. For an LED lamp connected to a leadframe, the electrical connection is through the leadframe. A number of leadframes are connected in parallel to make a batch for coating. For an LED wafer or circuit board containing a plurality of LED chips, the electrical connection is through an interface providing connection to each of the LED junctions. The electrical connection is made by any arrangement performing the function of providing voltage across the semiconductor device.

The bath 32 comprises a fluid solvent, such as isopropyl alcohol, with a solid electrolyte, such as magnesium nitrate ($Mg(NO_3)_2$), sodium nitrate ($NaNO_3$), or any other chemical compound (salt, acid, or base) that dissociates into electrically charged ions when dissolved in the fluid solvent. The resulting electrolyte dissolved in the solvent is used to make the solvent conductive. The bath 32 also contains suspended particles such as phosphor particles, as described herein. The bath 32 is typically held in a basin for batch processing of semiconductor devices, although in other embodiments the bath 32 flows through a channel for continuous processing. A small amount of water is generally added to the bath 32 to enhance the reaction rate and adhesion properties. For the exemplary case of a magnesium nitrate electrolyte, magnesium hydroxide is produced at the cathode by the hydrolysis of water, which reacts with the magnesium ions. The magnesium hydroxide acts as a binder for the phosphor deposited on the cathode, increasing the adherence of the phosphor to the substrate surface. The electrolyte also positively charges the particles to be deposited, such as phosphor particles, so that the particles are driven by an electric field onto a cathode where they adhere.

The EP deposition apparatus 30 generally includes a stirring device (not shown) to keep the bath 32 mixed. The solution is well mixed by stirring, such as stirring for 24 hours. The anode 34 is a large plate of platinum, carbon, or other inert conducting material. The semiconductor device 50 is mechanically disposed in the bath 32 with a frame (not shown) supporting the semiconductor device 50 or a plurality of semiconductor devices. Typically, the frame is arranged to avoid interfering with the flow of the bath 32 and particle deposition. The frame is any arrangement performing the function of disposing the semiconductor device in the bath.

The semiconductor device 50 has a p-i-n junction and comprises a p side 52, an active region 54, and an n side 56. The semiconductor device 50 is any semiconductor device having a semiconductor junction, such as a light emitting diode (LED), electroluminescent device, laser diode, pnp or npn transistor, Charge-Coupled Devices CCD, CMOS imager, amorphous silicon device, X-ray imager, phototransistor or any other semiconductor or semiconductor device arrays. One or more semiconductor devices may be disposed in the bath and may be connected to the power supplies. The first power supply 36 is connected between the anode 34 and the p side 52 of the semiconductor device 50 to supply a first biasing voltage; the second power supply 38 is connected between the p side 52 and the n side 56 of the semiconductor device 50 to supply a second biasing voltage. The first power supply 36 maintains the anode 34 at a positive voltage with respect to the p side 52 to drive the phosphor particles toward the semiconductor device 50. The p side 52 acts as the bath cathode. The semiconductor device 50 is a single device, such as a single LED, or arrays of semiconductor devices, such as a plurality of LEDs mounted on a PC board.

Those skilled in the art will appreciate that the particular electrode separation between the anode 34 and the p side 52, voltages, and semiconductor device configuration is varied depending on the conditions, sample size, conductivity, and the results desired. For example, an electrode separation between the anode 34 and the p side 52 of about 3 to 10 cm and first power supply 36 voltage of about 40 to 500 Volts is used. The current varies from about 5 to 100 mA/cm2 depending on the area size to be coated and the deposition time desired. Feature sizes as small as 40 µm with coatings of 2 to 10 mg/cm2 have been achieved with the present EP deposition process.

Applying a potential across the semiconductor device 50 locally affects the phosphor particles' deposition. The local field strength is much greater than the field strength between the anode 34 and the p side 52, because the thickness of the active region 54 in the semiconductor device 50 is typically very small. In one embodiment, the second power supply 38 supplies a positive voltage to the n side 56 with respect to the p side 52 so that the semiconductor device 50 is reverse biased. In another embodiment, the second power supply 38 is switchable so that the second power supply 38 supplies a positive voltage to the n side 56 with respect to the p side 52 (semiconductor device 50 reverse biased), supplies neutral voltage to the n side 56 with respect to the p side 52 (semiconductor device 50 zero biased), or supplies a negative voltage to the n side 56 with respect to the p side 52 (semiconductor device 50 forward biased).

Although FIG. 3A provides the example of applying voltages with the first power supply 36 connected between the anode 34 and the p side 52, and the second power supply 38 connected between the p side 52 and the n side 56, different configurations can be used to produce the relative voltages required. In another embodiment, the second power supply can be connected between the anode 34 and the n side 56 to provide the second biasing voltage across the semiconductor device 50, with the first power supply 36 remaining connected between the anode 34 and the p side 52. In yet another embodiment, the p side 52 and the n side 56 can be shorted together to zero bias the semiconductor device 50.

FIG. 3B shows a potential plot relative to the position of the elements shown in FIG. 3A for different biasing of the semiconductor device. The potential between the anode 34 and the p side 52 (bath cathode) is supplied by the first power supply 36. In experiments, spacings between the anode 34 and the p side 52 of 3 to 6 cm were used with potentials of 20 to 200 Volts, creating field strengths of 3.33 to 66.67 Volts/cm. The potential between the p side 52 and the n side 56 is supplied by the second power supply 38. The voltage drop across the semiconductor device 50 is small in magnitude compared to the potential between the anode 34 and the p side 52, but the spacing between the p side 52 and the n side 56 is small, so the resulting field strength is large. A voltage drop across the semiconductor device 50 of approximately 0.2 to 0.4 Volts with a spacing of 1 to 2 µm yields a field strength of about 2,000 Volts/cm. Although the actual effect may be smaller due to local interaction between the solution and the sides of the semiconductor device, the field strength is substantial and the various bias modes are used to achieve different results. Three biasing modes are defined depending how the second power supply 38 voltage is applied: forward biasing when the p side voltage is greater than the n side voltage, zero biasing when the p side voltage is the same as the n side voltage, and reverse biasing when the p side voltage is less than the n side voltage.

At zero bias between the p side and n side, the electric field across the semiconductor device 50 will be zero at the p side 52, become increasingly negative (for example, by about 2 Volts in an InGaN diode), before increasing to become zero again at the start of the n side 56. The potential across the semiconductor device 50 will therefore become increasingly more positive between the p side 52 and n side 56. Under this condition if the p side 52 and n side 56 are connected, the lowest field point will be at the center of the active region 54, and phosphor particles will deposit there first.

For zero biasing near equilibrium conditions, the high junction field in the semiconductor device 50 will spread into the bath 32 and quickly results in the phosphor particles being deposited along the sides of the semiconductor device 50. However, the high driving rate can quickly deplete phosphor particles from the bath 32 close to the high field strength region. The size of the depleted region will depend on the diffusion rate of the phosphor particles in the bath 32. Unless more phosphor particles can diffuse into the bath 32 around this high field strength region, the EP deposition process will slow down to match the rate at which phosphor particles can diffuse into this region, limiting the layer thickness and deposition rate.

For forward bias across the semiconductor device 50, the voltage drop across the depletion region of the semiconductor device 50 becomes very small as the applied voltage becomes equal to the built-in bias of the semiconductor device 50. Thus, the junction field strength and field distribution in the bath 32 near the semiconductor device 50 is greatly reduced and approaches zero. The potential of the n side 56 is close to that of the p side 52, so the highest voltage drop in the bath 32 occurs between the bath anode 34 and all surfaces of the semiconductor device 50. For the exemplary device, the phosphor deposition will not be discriminatory and will cover the entire LED, including the reflective cup if it is connected to the n side. The forward biasing voltage is kept below the rated voltage for the semiconductor device to avoid damage to the semiconductor device.

Another embodiment using forward biasing involves the use of the light emission from the LED inside the bath 32 to photoelectrically enhance deposition of the phosphor particles in the light emitting areas of the semiconductor device 50. This is a result of the "photoelectric effect," which enhances the conductivity of some materials through ionization. Therefore, the conductivity of ionized particles in the vicinity of the LED light emitting areas is enhanced, resulting in thicker deposition layers where the light flux is higher. This leads to a more uniform down-conversion of the LED light and subsequently a more isotropic optical emission from the device.

For reverse bias across the semiconductor device 50, the n side 56 of the semiconductor device 50 will have a high positive voltage with respect to the p side 52 of the semiconductor device 50 and also a small negative voltage with respect to the bath anode 34. Thus, the potential profile driving the deposition of the phosphor particles will be steepest between the bath anode 34 and the p side 52 of the semiconductor device 50. Most phosphor particles will be deposited at p side 52. For the exemplary process of phosphor deposition on an LED, the phosphor particles are preferably deposited on the top of the p side 52 and on the sides of the LED very close to the active region 54, as required for best performance in most applications. The reverse biasing voltage is kept below the reverse bias breakdown voltage for the semiconductor device to avoid damage to the semiconductor device. The reverse bias breakdown voltage is large for most semiconductor devices, such as InGaN diodes, so the reverse bias breakdown voltage does not present a practical limitation.

Sequential application of the different biasing modes is used to tailor the phosphor particles' deposition on the semiconductor device to the desired thickness and location. Forward biasing the semiconductor device is used to coat the side of the semiconductor device. Reverse biasing the semiconductor device is used to coat the top of the semiconductor device. Thus, by alternating forward and reverse biasing, a coating profile is deposited which optimizes the coating thickness between the top and sides of the semiconductor device. For the exemplary device, the phosphor coating is distributed between the top and sides of the LED to optimize the production of light from the LED without wasting phosphor coating in locations where little or no light is produced.

The EP deposition process is used even if the LED chip 80 of FIG. 1 is inverted, so that the n side becomes the top 81 and the p side is attached to the reflective cup 92. Applying a reverse bias during the EP deposition process, phosphor coating will be driven to the p side, coating the sides of the LED chip near the p side where most light is emitted. Subsequently applying a reduced reverse bias or a forward bias can produce more deposition on the n side at the top of the LED chip. Pre coating can also be used with the inverted LED chip in order to produce a more even potential drop across the various device surfaces as described below.

In one embodiment, the coating is applied to the semiconductor device while reverse biasing the semiconductor device. In another embodiment, the coating is applied to the semiconductor device while alternately forward biasing and reverse biasing the semiconductor device. In another embodiment, the coating is applied to the semiconductor device after first applying a pre coating to the semiconductor device.

Although the exemplary case of phosphor particle deposition has been discussed herein, the particles suspended in bath 32 for deposition on a semiconductor device in accordance with the present invention are not limited to phosphor particles. Optical materials, high resistivity dielectric materials, silica, titanium dioxide, or any particle that can be deposited by EP deposition, and combinations thereof, can be used. The different materials are typically used singly in the bath, but in some embodiments, two or more different materials are mixed simultaneously within the bath.

An optional pre coating is used to account for local features of the semiconductor device that disturb the electrical potential across the surface of the semiconductor device during the EP deposition process and result in uneven coating. For example, gold electrical contacts are often used to make the electrical connection to the highly doped semiconductor in the semiconductor device. In another example, dielectric layers are often applied to various surfaces of the semiconductor device for passivation. The differences in dielectric constants of the various materials disturb the electrical lines of force around the semiconductor device: lines of force bunch up near high conductivity regions on the surface, such as metals, and spread out near low conductivity regions, such as dielectrics. The suspended particles' deposition follows the lines of force, resulting in an uneven coating.

The pre coating is a high resistivity dielectric material, such as silica ($SiO_2$) or titanium dioxide ($TiO_2$), or other oxide system applied by the EP deposition process, where the high resistivity dielectric material is deposited from suspended particles in the bath. In one embodiment, the pre-coating suspended particles are contained in a different bath from the bath used to deposit phosphors. In another embodiment, the pre-coating suspended particles are mixed in the same bath with the phosphors. The pre-coating may be either transparent (e.g. $SiO_2$) or diffuse (e.g. $TiO_2$) to visible light depending on the desired optical effect. The pre coating suspended particles are initially deposited in high conductivity regions, where the field lines are closely bunched. The pre coating makes the high conductivity regions less conductive as the pre coating suspended particles are deposited, evening out the field lines, so that fewer pre coating suspended particles are deposited in the formerly high conductivity regions as the pre coating process continues. The pre coating process results in an equal potential surface across the semiconductor device, so that the coating is evenly applied.

The pre coating process can also use the different biasing modes to tailor the pre coating on the semiconductor device to the desired thickness and location. For the exemplary semiconductor device, silica pre coating is deposited on the LED, initially at zero bias, then at forward bias. The n side and junction regions of the LED will be coated with a resistive layer. When the phosphor coating is subsequently deposited in the reverse bias mode, the driving field for deposition will be less in the n side and junction regions of the LED, increasing the deposition on the p side of the LED where phosphor deposition is most desired. In certain embodiments, the particles deposited in the pre-coating process have a bimodal distribution, analogous to the description herein for the electrophoretic phosphor deposition process; however, the mean particle sizes for the pre-coating process may differ from the ranges set forth for the particles of phosphor material, and may be any useful combination of sizes desired. In particular embodiments, the mean particle sizes for the pre-coating process are within the ranges set forth for the particles of phosphor material. In still other embodiments the pre-coating process will use particulate materials having a particle size distribution that is not bimodal.

In another embodiment, a hydrophobic mask, such as plastic or photoresist is applied to the semiconductor device to protect selected areas on the semiconductor device and associated package from exposure to the bath. The mask will also serve to insulate certain metallic or conductive areas (such as leadframes, circuit interconnects, etc.) used for packaging the semiconductor device. This will prevent the phosphor or dielectric materials from unnecessarily coating conductive but non-light emitting areas. The hydrophobic mask is applied by conventional means, such as spraying through a mask, silk screening, or vapor deposition. The hydrophobic mask is applied with spraying apparatus, printing apparatus, chemical apparatus, or any apparatus performing the function of masking the semiconductor device.

The application of the mask could be only temporary, prior to insertion of the device package into the electrolyte bath, or, depending on the material, could become a permanent layer protecting the device package from subsequent handling. Suitable materials such as photoresist are used for temporary masks to allow easy removal with a solvent solution. The application of a mask also helps reduce the amount of materials used for each EP deposition run. The effective conducting surface area exposed to the bath is reduced, preserving the phosphor, dielectric, and electrolyte in the bath for subsequent deposition runs.

Those skilled in the art will appreciate that a variety of treatments are used after the semiconductor device is removed from the bath to complete manufacture. The semiconductor device is removed from the bath, washed in isopropyl alcohol, washed in deionized water, and dried, such as drying in an oven for about 20 minutes at about 100 to 200 degrees Celsius. Optionally, the semiconductor device is heat treated to harden the coating. A liquid polymer system, such as polypropylene, polycarbonate, epoxy resin, or silicone, may be used to construct a lens over the semiconductor device, as required.

The electrophoresis bath typically comprises at least one, typically at least two (or three, or four) types of phosphor particles, which each have their own emission characteristics. In an embodiment, the electrophoresis bath includes two different types of phosphor particles (phosphor particles of a first type of phosphor material, and phosphor particles of a second type of phosphor material). In one embodiment, the semiconductor device disposed in the bath is selected from a blue diode or a violet diode, the first type of phosphor particles is capable of emitting red light upon excitation by the light from the diode, and the second type of phosphor particles is capable of emitting green light upon excitation by the light from the diode. In such an embodiment, the light emitting device thus emits light having a plurality of wavelength components, due to (a) light emitted from the diode that passes (unabsorbed) through the phosphor layer, (b) red light resulting from down-conversion of phosphor-absorbed, diode-emitted light, and (c) green light resulting from down-conversion of phosphor-absorbed, diode-emitted light. The result is a light emitting device that emits white light.

In another embodiment, the electrophoresis bath comprises a single type of phosphor particles that have a bimodal particle size distribution and are capable of emitting yellow light upon excitation by blue or violet light, and the diode is selected from a blue diode or a violet diode. In such an embodiment the light emitting device thus emits light having a plurality of wavelength components, due to (a) light emitted by the diode that passes (unabsorbed) through the phosphor layer, and (b) yellow light resulting from down-conversion of phosphor-absorbed, diode-emitted light. The result is a light emitting device that emits white light.

The phosphor particles are characterized as being capable of down-conversion, that is, after being stimulated (excitation) by relatively shorter wavelength light, they produce longer wavelength light (emission). For red emission, typical phosphor particles suitable for use in accordance with the invention include a material selected from $SrS:Eu^{2+}$; $CaS:Eu^{2+}$; $CaS:Eu^{2+},Mn^{2+}$; $(Zn,Cd)S:Ag^+$; $Mg_4GeO_{5.5}F:Mn^{4+}$; $Y_2O_2S:Eu^{2+}$, $ZnS:Mn^{2+}$, and other phosphor materials having emission spectra in the red region of the visible spectrum upon excitation as known in the art. For green emission, typical phosphor particles suitable for use in the method of the invention include a material selected from $SrGa_2S_4:Eu^{2+}$; $ZnS:Cu,Al$ and other phosphor materials having emission spectra in the green region of the visible spectrum upon excitation as known in the art. In certain embodiment, blue emitting phosphor particles may be used in the method of the present invention in addition to the red- and green-emitting phosphors; suitable blue emitting phosphor particles may comprise, e.g. $BaMg_2Al_{16}O_{27}:Eu^{2+},Mg$ or other phosphor materials having emission spectra in the blue region of the visible spectrum upon excitation as known in the art. In another embodiment, the phosphor particles suitable for use in method of the present invention produce yellow light upon excitation, for example a phosphor material such as $(Y,Gd)_3Al_5O_{12}$:Ce,Pr and other phosphor materials having emission spectra in the yellow region of the visible spectrum upon excitation as described herein.

Phosphor particles for certain embodiments may be obtained from Phosphor Technology, Ltd. (Essex, England). A suitable phosphor material obtained from this source is Strontium Sulphide: Europium (SrS:$Eu^{2+}$) (Part no. name: HL63/S-D1). This phosphor material may be supplied in several particle sizes; one such lot of phosphor material has a particle size distribution (as measured by a Coulter Counter with 50 micron aperture) as shown below:

| Ultrasonic Dispersion. Size at listed Volume % | | | | | |
|---|---|---|---|---|---|
| vol % | 5 | 25 | 50 | 75 | 95 |
| micron | 2.3 | 3.5 | 5.0 | 7.2 | 11.9 |
| Quartile Deviation: 0.35 | | | | | |

This red-emitting phosphor material has an emission wavelength peak at about 615 nm and an excitation wavelength peak in the range of about 460–490 nm.

Another suitable phosphor material obtained from Phosphor Technology, Ltd. is Strontium Thiogallate: Europium (SrGa$_2$S$_4$:$Eu^{2+}$). This phosphor material may be supplied in several particle sizes; an exemplary lot of this phosphor material has a particle size distribution (as measured by Coulter Counter with a 50 micron aperture) as shown below:

| Ultrasonic Dispersion. Size at listed Volume % | | | | | |
|---|---|---|---|---|---|
| vol % | 5 | 25 | 50 | 75 | 95 |
| micron | 1.7 | 3.1 | 5.0 | 7.5 | 14.7 |
| Quartile Deviation: 0.32 | | | | | |

This green-emitting phosphor material has an emission wavelength peak at about 535 nm and an excitation wavelength peak in the range of about 440–470 nm.

Another suitable phosphor obtained from Phosphor Technology, Ltd. is (Yttrium, Gadolinium) Aluminate Phosphor ($(Y,Gd)_3Al_5O_{12}$:Ce,Pr). This phosphor material may be supplied in several particle sizes; an exemplary lot of this phosphor material has a particle size distribution (as measured by Coulter Counter with 50 micron aperture) as shown below:

| Ultrasonic Dispersion. Size at listed Volume % | | | | | |
|---|---|---|---|---|---|
| vol % | 5 | 25 | 50 | 75 | 95 |
| micron | 1.7 | 2.9 | 4.0 | 5.6 | 9.4 |
| Quartile Deviation: 0.32 | | | | | |

This yellow-emitting phosphor material has an emission wavelength peak at about 570 nm and an excitation wavelength peak at about 470 nm.

Other suitable phosphors for use in devices according to the present invention may be obtained from this and other commercial sources. The preparation of phosphors is described in the literature and suitable phosphors may be prepared accordingly by one of ordinary skill given the disclosure herein.

While the foregoing embodiments of the invention have been set forth in considerable detail for the purpose of making a complete disclosure of the invention, it will be apparent to those of skill in the art that numerous changes may be made in such details without departing from the spirit and the principles of the invention. Accordingly, the invention should be limited only by the following claims.

All patents, patent applications, and publications mentioned herein are hereby incorporated by reference in their entireties.

What is claimed is:

1. A method for coating a semiconductor device, the semiconductor device having a p side and an n side, the method comprising:
    a) providing a bath containing suspended particles, the suspended particles comprising particles of a first phosphor material and particles of a second phosphor material, the particles of the first phosphor material having a mean particle size in the range from about 1 micron to about 6 microns, the particles of the second phosphor material having a mean particle size in the range from about 12 microns to about 25 microns, wherein the particle size distribution of the phosphor material in the bath is bimodal,
    b) positioning a semiconductor device in the bath,
    c) applying a first biasing voltage between an anode in electrical contact with the bath and the p side to hold the anode at a positive voltage with respect to the p side,
    d) applying a second biasing voltage between the p side and the n side.

2. The method of claim 1 wherein the semiconductor device is selected from the group consisting of a light emitting diode (LED), an electroluminescent device, a laser diode, a pnp transistor, an npn transistor, a Charge-Coupled Device CCD, a CMOS imager, an amorphous silicon device, an X-ray imager, a photo-transistor, a semiconductor, and a semiconductor device array.

3. The method of claim 1 wherein the first phosphor material has a particle size distribution such that the span of particle diameters from the 25th volume percentile to the 75th volume percentile is in the range from about 2 microns to about 6 microns.

4. The method of claim 1 wherein the second phosphor material has a particle size distribution such that the span of particle diameters from the 25th volume percentile to the 75th volume percentile is in the range from about 2 microns to about 10 microns.

5. The method of claim 1 wherein the suspended particles further comprise one or more of the group consisting of optical materials, high resistivity dielectric materials, silica, titanium dioxide, and a third phosphor material.

6. The method of claim 1 wherein the second biasing voltage is selected from the group consisting of reverse bias, zero bias, and forward bias.

7. The method of claim 1 wherein applying a second biasing voltage between the p side and the n side further comprises applying a second biasing voltage switchable between a reverse bias, a zero bias, and a forward bias.

8. The method of claim 1 wherein applying a second biasing voltage between the p side and the n side comprises applying a voltage between the anode and the n side.

9. The method of claim 1 further comprising pre-coating the semiconductor device.

10. The method of claim 9 wherein pre-coating the semiconductor device comprises pre coating the semiconductor device with a high resistivity dielectric material coating.

11. The method of claim 1 wherein applying a second biasing voltage between the p side and the n side further comprises applying a second biasing voltage between the p side and the n side to cause the semiconductor device to emit light, the light ionizing the bath.

12. The method of claim 1, wherein at least one of the group consisting of the first phosphor material and the second phosphor material comprises a material selected from $SrS:Eu^{2+}$; $CaS:Eu^{2+}$; $CaS:Eu^{2+},Mn^{2+}$; $(Zn,Cd)S:Ag^+$; $Mg_4GeO_{5.5}F:Mn^{4+}$; and $ZnS:Mn^{2+}$.

13. The method of claim 1, wherein at least one of the group consisting of the first phosphor material and the second phosphor material comprises a material selected from SrGa2S4:Eu2+ and ZnS:Cu,Al.

14. The method of claim 1, wherein at least one of the group consisting of the first phosphor material and the second phosphor material comprises $(Y,Gd)_3Al_5O_{12}:Ce,Pr$.

15. A method for coating a light emitting diode, the light emitting diode having a p side and an n side, the method comprising:
   a) providing a bath containing suspended phosphor particles, the suspended phosphor particles comprising particles of a first phosphor material and particles of a second phosphor material, the particles of the first phosphor material having a mean particle size in the range from about 1 micron to about 6 microns, the particles of the second phosphor material having a mean particle size in the range from about 12 microns to about 25 microns, wherein the particle size distribution of the phosphor material in the bath is bimodal,
   b) positioning a light emitting diode in the bath,
   c) applying a first biasing voltage between an anode in electrical contact with the bath and the p side to hold the anode at a positive voltage with respect to the p side,
   d) applying a second biasing voltage between the p side and the n side.

16. The method of claim 15, wherein said phosphor particles are capable of absorbing light from the diode and emitting light having a longer wavelength than the light from the diode such that the combination of light emitted from the diode and light emitted from the phosphor particles appears white to the human eye.

17. The method of claim 15, wherein the bath further comprise one or more of the group consisting of optical materials, high resistivity dielectric materials, silica, titanium dioxide, a third phosphor material, an electrolyte, and a binder material.

18. The method of claim 15, wherein the first phosphor material has a particle size distribution such that the span of particle diameters from the 25th volume percentile to the 75th volume percentile is in the range from about 2 microns to about 6 microns.

19. The method of claim 15, wherein the second phosphor material has a particle size distribution such that the span of particle diameters from the 25th volume percentile to the 75th volume percentile is in the range from about 2 microns to about 10 microns.

20. The method of claim 15 wherein the second biasing voltage is selected from the group consisting of reverse bias, zero bias, and forward bias.

21. The method of claim 15 wherein applying a second biasing voltage between the p side and the n side further comprises applying a second biasing voltage switchable between a reverse bias, a zero bias, and a forward bias.

22. The method of claim 15 wherein applying a second biasing voltage between the p side and the n side comprises applying a voltage between the anode and the n side.

23. The method of claim 22 wherein applying a second biasing voltage between the p side and the n side further comprises switching the second biasing voltage between a reverse bias, a zero bias, and a forward bias.

24. The method of claim 15 further comprising pre coating the light emitting diode with silica.

25. The method of claim 15 further comprising masking the light emitting diode.

26. The method of claim 15, wherein at least one of the group consisting of the first phosphor material and the second phosphor material comprises a material selected from $SrS:Eu^{2+}$; $CaS:Eu^{2+}$; $CaS:Eu^{2+},Mn^{2+}$; $(Zn,Cd)S:Ag^+$; $Mg_4GeO_{5.5}F:Mn^{4+}$; and $ZnS:Mn^{2+}$.

27. The method of claim 15, wherein at least one of the group consisting of the first phosphor material and the second phosphor material comprises a material selected from $SrGa_2S4:Eu^{2+}$ and ZnS:Cu,Al.

28. The method of claim 15, wherein at least one of the group consisting of the first phosphor material and the second phosphor material comprises $(Y,Gd)_3Al_5O_{12}:Ce,Pr$.

* * * * *